(12) United States Patent
Hu et al.

(10) Patent No.: US 11,580,377 B2
(45) Date of Patent: Feb. 14, 2023

(54) METHOD AND DEVICE FOR OPTIMIZING NEURAL NETWORK

(71) Applicants: TuSimple, Inc., San Diego, CA (US); Beijing Tusen Zhitu Technology Co., Ltd., Beijing (CN)

(72) Inventors: Yuwei Hu, Beijing (CN); Jiangming Jin, Beijing (CN); Lei Su, Beijing (CN); Dinghua Li, Beijing (CN)

(73) Assignees: TU SIMPLE, INC., San Diego, CA (US); BEIJING TUSEN ZHITU TECHNOLOGY CO., LTD., Beijing (CN)

( * ) Notice: Subject to any disclaimer, the term of this patent is extended or adjusted under 35 U.S.C. 154(b) by 1189 days.

(21) Appl. No.: 16/014,869

(22) Filed: Jun. 21, 2018

(65) Prior Publication Data

US 2018/0373981 A1 Dec. 27, 2018

(30) Foreign Application Priority Data

Jun. 21, 2017 (CN) .......................... 201710474712.0

(51) Int. Cl.
G06F 17/15 (2006.01)
G06N 3/08 (2023.01)
G06F 12/02 (2006.01)
H03M 7/30 (2006.01)
G06N 3/063 (2023.01)
G06N 3/04 (2023.01)
(Continued)

(52) U.S. Cl.
CPC ............ *G06N 3/08* (2013.01); *G06F 12/0207* (2013.01); *G06F 17/153* (2013.01); *G06F 17/16* (2013.01); *G06N 3/0454* (2013.01); *G06N 3/063* (2013.01); *G06N 20/10* (2019.01); *H03M 7/30* (2013.01)

(58) Field of Classification Search
CPC ...... G06N 3/08; G06N 3/063; G06F 12/0207; G06F 17/153; G06F 17/16
USPC .......................................................... 708/420
See application file for complete search history.

(56) References Cited

U.S. PATENT DOCUMENTS 8,392,117 B2    3/2013  Dolgov

OTHER PUBLICATIONS

CNIPA Fourth Office Action, Chinese Patent Application No. 201710474712.0, dated Jun. 16, 2020.
(Continued)

*Primary Examiner* — Tan V Mai
(74) *Attorney, Agent, or Firm* — Paul Liu; Perkins Coie, LLP

(57) ABSTRACT

The embodiments of this application provide a method and device for optimizing neural network. The method includes: binarizing and bit-packing input data of a convolution layer along a channel direction, and obtaining compressed input data; binarizing and bit-packing respectively each convolution kernel of the convolution layer along the channel direction, and obtaining each corresponding compressed convolution kernel; dividing the compressed input data sequentially in a convolutional computation order into blocks of the compressed input data with the same size of each compressed convolution kernel, wherein the data input to one time convolutional computation form a data block; and, taking a convolutional computation on each block of the compressed input data and each compressed convolution kernel sequentially, obtaining each convolutional result data, and obtaining multiple output data of the convolution layer according to each convolutional result data.

20 Claims, 12 Drawing Sheets

(51) Int. Cl.
    *G06F 17/16*     (2006.01)
    *G06N 20/10*     (2019.01)

(56) References Cited

OTHER PUBLICATIONS

Pedersoli, F., et al. 'Espresso: Efficient Forward Propagation for BCNN'. 31st Conference on Neutral Information Processing Systems (NIPS 2017), May 19, 2017, Long Beach, CA, USA.
Rastegari, M., et al. 'Xnor-net: imagenet classification using binary convulutional neutral networks'. In European Conference on Computer Vision (pp. 525-542). Aug. 2, 2016. Springer, Cham.
Hinton, Geoffrey, Vinyals, Oriol, and Dean, Jeff, "Distilling the Knowledge in a Neural Network", Cornell University Library, arXiv:1503.02531 [stat.ML], Mar. 9, 2015.
Adriana Romero, Nicolas Ballas, Samira Ebrahimi Kahou, Antoine Chassang, Carlo Gatta & Yoshua Bengio, "Fitnets: Hints for Thin Deep Nets", Cornell University Library, arXiv:1412.6550 [cs.LG], Published as a conference paper at ICLR 2015, Mar. 27, 2015.
Sergey Zagoruyko, and Nikos Komodakis, "Paying More Attention To Attention: Improving the Performance of Convolutional Neural Networks Via Attention Transfer", arXiv:1612.03928v3 [cs.CV], Published as a conference paper at ICLR 2017, Feb. 12, 2017.

|   |   |   |   |
|---|---|---|---|
| X | X | X | X |
| X | X | X | X |
| X | X | X | X |
| X | X | X | X | h w the i-th channel data of the compressed convolution kernel

|   |   |   |   |
|---|---|---|---|
| X | X | X | X |
| X | X | X | X |
| X | X | X | X |
| X | X | X | X | h w the i-th channel data of the block of the compressed input data

Fig. 4b

Fig. 6a memory space A    memory space B    memory space C

Fig. 6b

METHOD AND DEVICE FOR OPTIMIZING NEURAL NETWORK

CROSS-REFERENCES TO RELATED APPLICATIONS

This application is based upon and claims priority to Chinese Patent Application No. 201710474712.0, titled "METHOD AND DEVICE FOR OPTIMIZING NEURAL NETWORK" and filed with the Patent Office of China on Jun. 21, 2017, the entire contents of which are incorporated herein by reference.

TECHNICAL FIELD

This application relates to the field of computer vision, and especially relates to a method and a device for optimizing neural network.

BACKGROUND

In recent years, deep neural networks have achieved great success in various applications of computer vision field, such as image classification, object detection, semantic segmentation and so on.

However, the deep neural networks, which are usually with large number of model parameters and requires large computing resources and high throughput, may hardly to be applied to some devices with low power consumption and low computation capability (such as embedded devices, integrated devices and so on).

SUMMARY

This application provides a method and device for optimizing neural network.

In one aspect, the embodiments of this application provide a method for optimizing neural network, including:

binarizing and bit-packing input data of a convolution layer along a channel direction, and obtaining compressed input data;

binarizing and bit-packing respectively each convolution kernel of the convolution layer along the channel direction, and obtaining each corresponding compressed convolution kernel;

dividing the compressed input data sequentially in a convolutional computation order into blocks of the compressed input data with the same size of each compressed convolution kernel, wherein the data input to one time convolutional computation form a data block; and, taking a convolutional computation on each block of the compressed input data and each compressed convolution kernel sequentially, obtaining each convolutional result data, and obtaining multiple output data of the convolution layer according to each convolutional result data.

In another aspect, the embodiments of this application provide a device for optimizing neural network, including a processor and at least one memory, the at least one memory storing at least one machine executable instruction, and the processor is configured to read the at least one machine executable instruction to perform the process of:

binarizing and bit-packing input data of a convolution layer along a channel direction, and obtaining compressed input data;

binarizing and bit-packing respectively each convolution kernel of the convolution layer along the channel direction, and obtaining each corresponding compressed convolution kernel;

dividing the compressed input data sequentially in a convolutional computation order into blocks of the compressed input data with the same size of each compressed convolution kernel, wherein the data included in one time convolutional computation represent a block of data; and taking a convolutional computation on each block of the compressed input data and each compressed convolution kernel sequentially, obtaining each convolutional result data, and obtaining multiple output data of the convolution layer according to each convolutional result data.

In another aspect, the embodiments of this application provide a device for optimizing neural network, including:

a first data processing element, configured to binarize and bit-pack input data of a convolution layer along a channel direction, and obtain compressed input data;

a second data processing element, configured to binarize and bit-pack respectively each convolution kernel of the convolution layer along the channel direction, and obtain each corresponding compressed convolution kernel;

a dividing element, configured to divide the compressed input data sequentially in a convolutional computation order into blocks of the compressed input data with the same size of each compressed convolution kernel, wherein the data included in one time convolutional computation represent a block of data;

a convolutional computing element, configured to take a convolutional computation on each block of the compressed input data and each compressed convolution kernel sequentially, and obtain each convolutional result data; and an output element, configured to obtain multiple output data of the convolution layer according to each convolutional result data.

BRIEF DESCRIPTION OF THE DRAWINGS

To more clearly describe the technical solution in the embodiments of this application or in the prior art, the accompany drawings to be used in the description of the embodiments or the prior art will be briefly introduced as follows. Apparently, the accompanying drawings described below are some embodiments of this application. For those skilled in the art, other drawings may also be concluded according to these drawings without inventive efforts.

FIG. 4b is a schematic diagram of channel data and channel convolution according to the embodiments of this application;

FIG. 6a is a schematic diagram of allocating memory space for output data of a convolution layer according to the embodiments of this application;

FIG. 6b is a schematic diagram of output data of a convolution layer according to the embodiments of this application;

DETAILED DESCRIPTION

Figure 1:
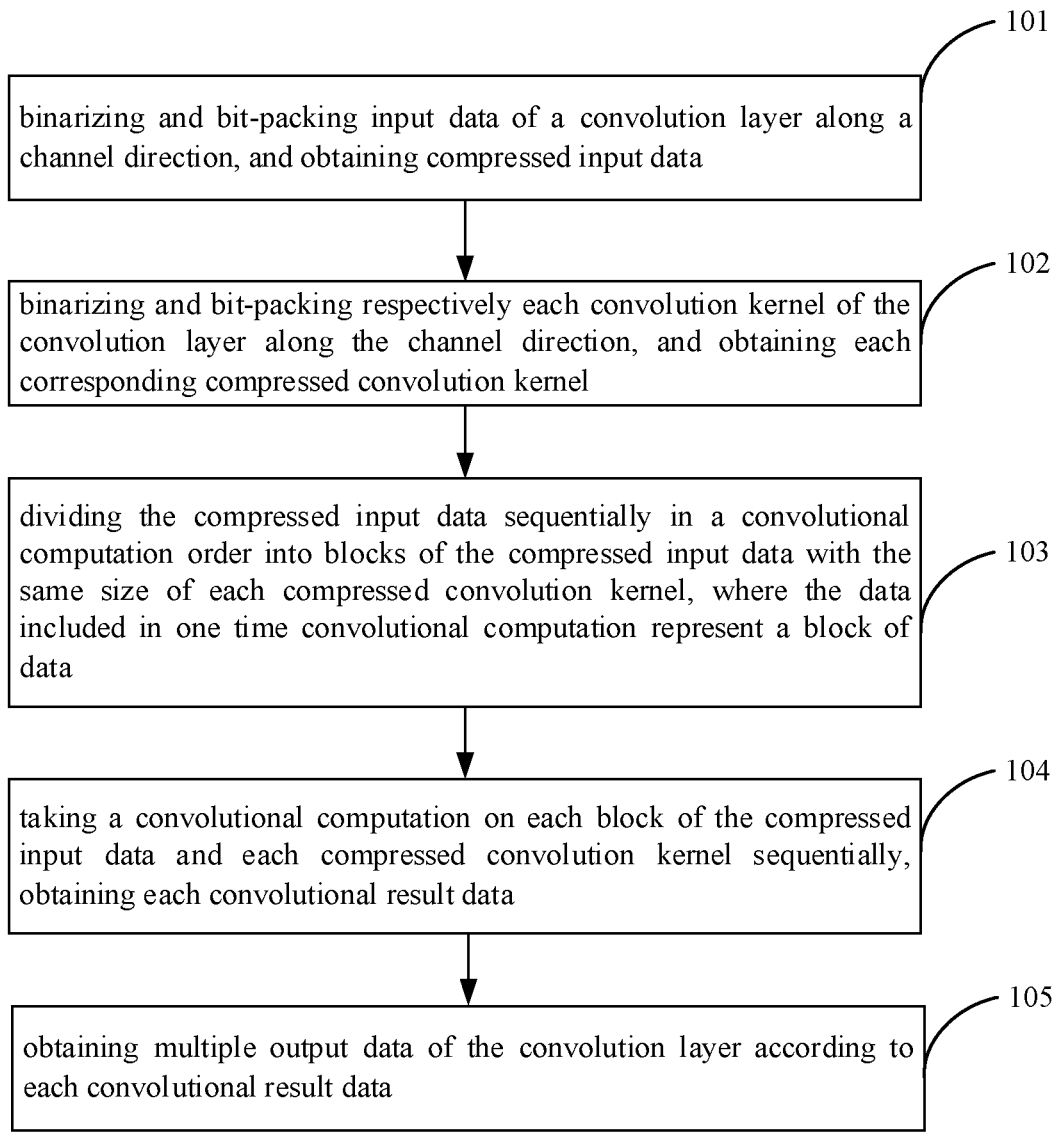
FIG. 1 is a first flow diagram of a method for optimizing neural network provided by the embodiments of this application.

To make the objectives, the technical solution and the advantages of the embodiments of this application clearer, the technical solution of the embodiments of this application will be clearly and completely described hereinafter with reference to the accompanying drawings in the embodiments of this application. Apparently, the embodiments described below are a part, instead of all, of the embodiments of this application. Based on the embodiments of this application, all other embodiments concluded by those skilled in the art without inventive efforts fall within the scope of protection of this application.

Embodiments of the present application provide a method and a device for optimizing neural network, so as to solve a technical problem of low computation speed and weak real time performance of neural networks in the prior art. The advantages provided by the embodiments of the application are illustrated as below.

Firstly, the neural networks optimized by embodiments of the present application may be more applicable to be used on CPUs for performing real time computations. In practical applications, since the input data of a convolution layer are usually three dimensional data, the convolution kernels of the convolution layer are usually four dimensional data, the number of channels of the layer are extremely large, and if performing convolutional computations on the input data with the convolution kernels, then large computation cost and huge latency may be brought. According to technical scheme of the present application, binarizing and bit-packing respectively the input data and each convolution kernel of a convolution layer along a channel direction, and obtaining compressed input data and compressed convolution kernels; then the cost of convolutional computations could be decreased, since the input data and each convolution kernel have been compressed along the channel direction; and the speed of convolutional computations could be improved, since convolutional computations of the input data and the convolution kernels are performed by unsigned integer-unsigned integer bit-wise operations in embodiments of the present application, and convolution computations are performed by float point-float point multiplications in the prior art; further, CPUs are good at bit-wise operations, therefore the neural networks optimized by embodiments of the application is more applicable to be used on CPUs for performing real time computations.

Secondly, the technical scheme of embodiments of the application could save memory space and improve computation speed. In the prior art, a convolutional computation of the input data and the convolution kernels is performed including the following steps: expanding the input data and the convolution kernels to be two dimension matrixes, where the input data and the convolution kernels are two kinds of tensors; multiplying these matrixes, and rearranging the results of the matrix-matrix multiplications to be tensors. By the prior art, on one aspect, extra memory spaces are allocated for storing the expanded matrixes, and memory consumption is increased; on another aspect, since the results of matrix-matrix multiplications are rearranged as tensors, the processing time is increased and the processing speed is decreased. By contrast, in the technical scheme of the present application, the input data are divided directly into blocks of data, the result data of convolutional computations on each data block and each compressed kernel are stored orderly on output tensors, so as to obtain output data. There is no extra memory to be allocated for storing matrixes, and no extra processing time is needed for rearranging the computation result data. Therefore, the technical scheme of embodiments of the application could save memory space and further improve computation speed.

Embodiment One

FIG. 1 illustrates a method for optimizing neural network provided by the embodiments of this application, including the following steps.

Step 101: binarizing and bit-packing input data of a convolution layer along a channel direction, and obtaining compressed input data.

Figure 2:
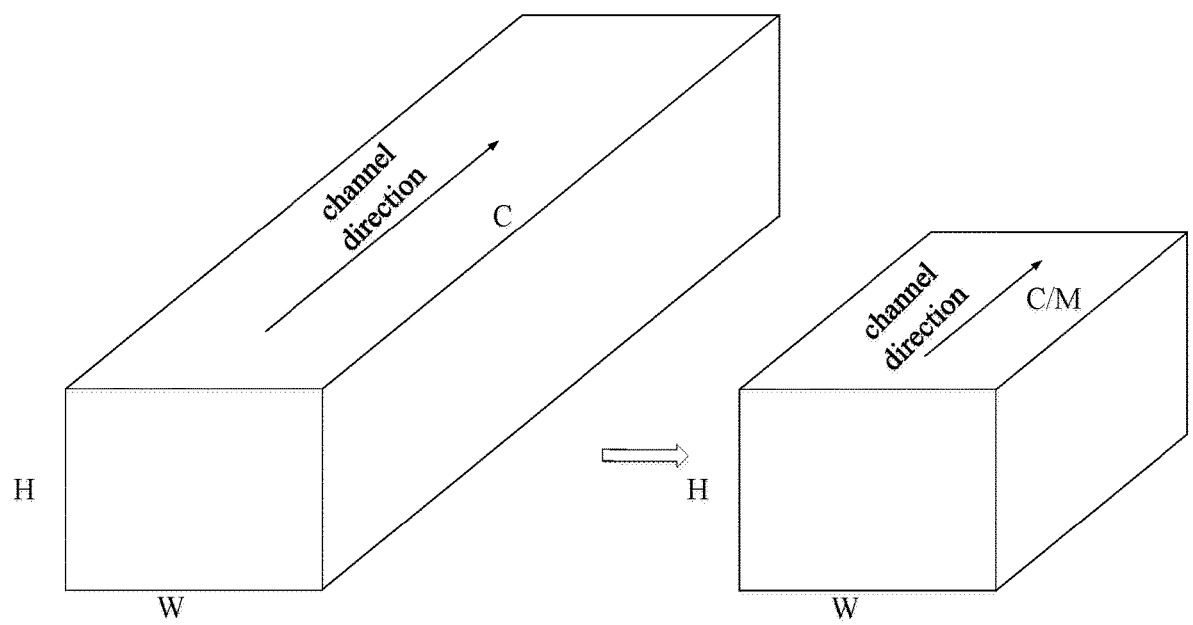
FIG. 2 is a schematic diagram of input data and the corresponding compressed input data according to the embodiments of this application.

The input data of the convolution layer are usually three dimension data, including dimensions of height, width and the number of channels, where the number of channels of the input data is large and usually a multiple of 32. FIG. 2 is a schematic diagram of the input data and the corresponding compressed input data, where H refers the height of the input data, W refers the width of the input data, and C refers the numbers of the channels of the input data; the height and the width of the compressed input data are the same as the height and the width of the input data, but the number of channels of the compressed input data is C/M, where M is a multiple of 32, e.g. the value of M is 32, 64, 128, or 256 and so on, which is not limited strictly in the present application.

Step 102: binarizing and bit-packing respectively each convolution kernel of the convolution layer along the channel direction, and obtaining each corresponding compressed convolution kernel.

Figure 3:
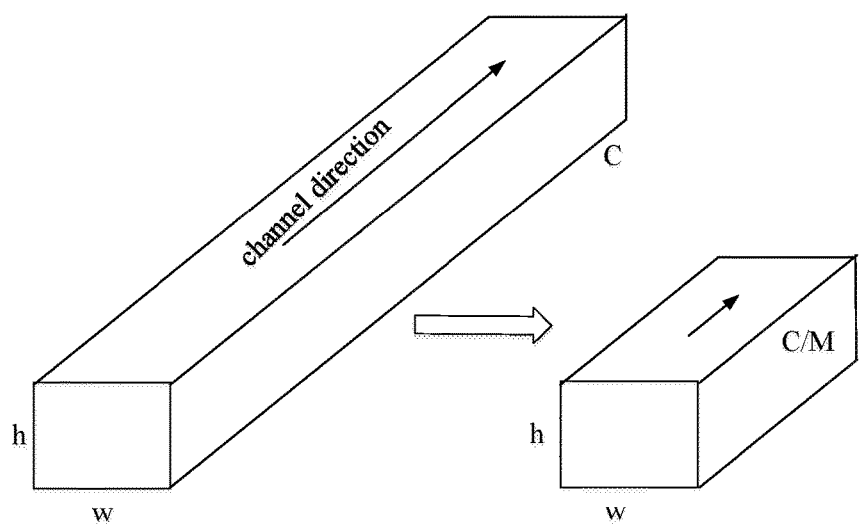
FIG. 3 is a schematic diagram of convolution kernels and the corresponding compressed convolution kernels according to the embodiments of this application.

The convolution kernels of the convolution layer are usually four dimension data, including dimensions of height, width, the number of channels of the convolution kernels and the number of convolution kernels. The height of each convolution kernel is the same with each other, and so do the width and the number of channels of each convolution kernel. The number of channels of each convolution kernel is the same with the number of channels of the input data, where the number of channels of the input data is usually a multiple of 32. FIG. 3 is a schematic diagram of a convolution kernel and a corresponding compressed convolution kernel, where h refers the height of the convolution kernel, w refers the width of the convolution kernel, C refers the number of channels of the convolution kernel; and the height and the width of the compressed convolution kernel are the same with the height and the width of the convolution kernel, while the number of channels of the compressed kernel is represented as C/M.

Step 103: dividing the compressed input data sequentially in a convolutional computation order into blocks of the compressed input data with the same size of each compressed convolution kernel, where the data included in one time convolutional computation represent a block of data.

Figure 4A:
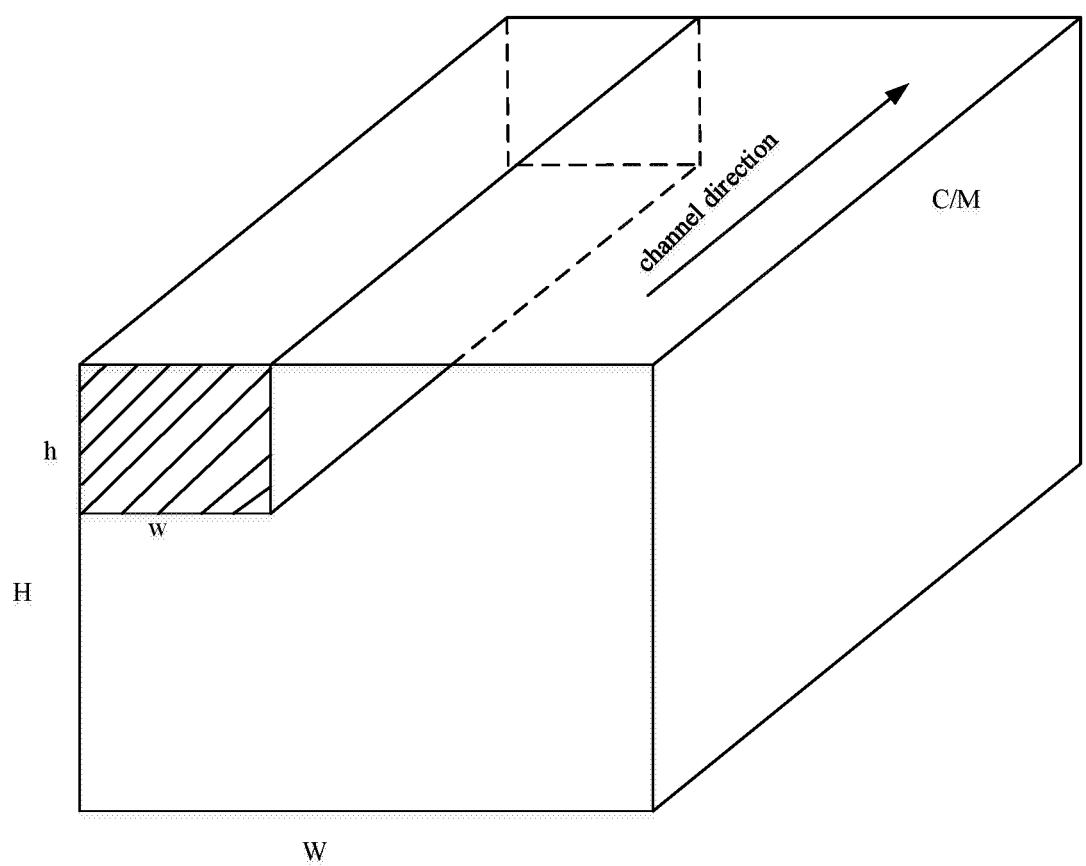
FIG. 4a is a schematic diagram of data blocks of compressed input data according to the embodiments of this application.

A block of data divided from the compressed input data is illustrated in FIG. 4a. The block of data is three dimension data, where the height of the block is h, the width of the block is w, and the number of channels of the block is C/M.

Assumed that the size of the compressed input data is 5*5*6 (H*W*C/S), the size of the compressed convolution kernel is 3*3*6 (H*W*C/S), then the size of a block of the compressed input data is 3*3*6 (H*W*C/S); since if the convolution step is 1 then the compressed input data are divided into 9 blocks of data.

Step 104: taking a convolutional computation on each block of the compressed input data and each compressed convolution kernel sequentially, obtaining each convolutional result data.

Step 105: obtaining multiple output data of the convolution layer according to each convolutional result data.

In embodiments of the application, each output data obtained in step 105 may be a two dimension matrix. The number of convolution kernels in the last convolution layer equals to the number of channels of input data of the next kernel, and each output data of the last convolution layer is input data of a channel of the next layer.

In some embodiments, the step 101 described above could be implemented as the following steps A1~A2.

Step A1: binarizing the input data of the convolution layer along the channel direction and obtaining binarized input data;

In embodiments of the application, the binarizing process could be performed on a binarization method described as equation (1) below:

$$x^b = \text{sign}(x) \begin{cases} +1 & x \geq 0 \\ -1 & x < 0 \end{cases} \quad \text{Equation (1)}$$

Apparently, the binarizing operation could be performed according to other binarization method, and the method may not be limited strictly on equation (1). For example, the data element with a value larger than 0 may be binarized as +1, and the data element with a value smaller than 0 may be binarized as 0.

Step A2: packing every M continuous data elements, from the first data element, of the binarized input data along the channel direction to be a new data element, where the M is a number of an integer multiple of 32.

Assumed that the binarized input data include 256 data elements, M is 32, the binarized input data could be packed into 8 integer data in 32 bits.

In some embodiments, the step 102 described above, for each convolution kernel of the convolution layer, could be implemented as the following steps B1~B2.

Step B1: binarizing the convolution kernel along the channel direction and obtaining a binarized convolution kernel;

Step B2: packing every M continuous data elements, from the first data element, of the binarized convolution kernel along the channel direction to be a new data element.

In some embodiments, the step 104 described above could be implemented as the following steps:

taking the convolution computation for each block of compressed input data and each compressed convolution kernel, where the convolution computation includes the following steps C3~C2:

Step C1: taking an inner product operation on each channel data of the block of the compressed input data and a corresponding channel data of the compressed convolution kernel, and obtaining each inner product result data of each channel data of the block of compressed input data and the corresponding channel data of the compressed convolution kernel;

Step: C2: determining the sum of the inner product result data of all channel data of the block of the compressed input data and all the corresponding channel data of the compressed convolution kernel as the convolution result data of the block of compressed input data and the compressed convolution kernel.

In some embodiments of the present application, the channel data of the block of the compressed input data described above indicate the data included in the block on a channel, and the channel data include multiple data elements, i.e. the channel data is a matrix, and each data element is a matrix element; the channel data of the compressed convolution kernel indicate the data included in the compressed convolution kernel on a channel, and the channel data include multiple data elements; and the inner product computation described in step C1, i.e. the inner product computation of the channel data of the block of compressed input data and the corresponding channel data of the compressed convolution kernel, could be implemented as the following steps:

Performing the step D1-D2 below for each channel data:

Step D1: taking an inner product operation including a XOR operation and a bit-count operation on each data element of the channel data of the block of compressed input data and each corresponding data element of the corresponding channel data of the compressed convolution kernel, and obtaining inner product result data of each data element of the channel data of the block of compressed input data and each corresponding data element of the corresponding channel data of the compressed convolution kernel;

Where the bit-count operation is an operation of counting the number of 1;

Step D2: obtaining the inner product result data of the channel data of the block of compressed input data and the corresponding channel data of the compressed convolution kernel, according to the inner product result data of each data element of the channel data of the block of compressed input data and each corresponding data element of the corresponding channel data of the compressed convolution kernel.

The inner product result data of the channel data of the compressed input data and the corresponding channel data of the compressed convolution kernel could be obtained in equation (2) below:

$$X_i \square W_i = N - 2 \times \left( \sum_{j=1}^{K} \text{bitcount}(XOR(x_{ij}, w_{ij})) \right) \quad \text{Equation (2)}$$

Where, in equation (2), X□$W_i$ refers the inner product result data of $X_i$, and $W_i$, $X_i$, refers the channel data of the block of compressed input data in the i-th channel, $W_i$ refers the channel data of the compressed convolution kernel in the i-th channel, $x_{ij}$ refers the j-th data element in the channel data $X_i$, $w_{ij}$ refers the j-th data element in the channel data $W_i$, K refers the number of data elements included in the channel data $X_i$, and N equals to K×M.

FIG. 4b is a scheme diagram of the i-th channel data of the block of the compressed input data and the i-th channel data of the compressed convolution kernel, where the size of the channel data of the block of compressed input data and the size of the channel data of a compressed convolution kernel are the same, where the width is w, the height is h, and K (K=w*h) elements are included respectively in the channel data of the block of the compressed input data and the channel data of the compressed convolution kernel.

In deep neural networks, for preventing the image diminishing problem, in the prior art, when taking convolution computations of input data and convolution kernels, the input data and the convolution kernels are expanded as two dimension matrixes, and the margin areas of the two dimension matrix expanded from the input data are padded with zero; since the two dimension matrix expended from the input data is large, the memory cost is huge, and certain time delay is added for the operation of padding zero in the margin areas of the matrixes.

Figure 5:
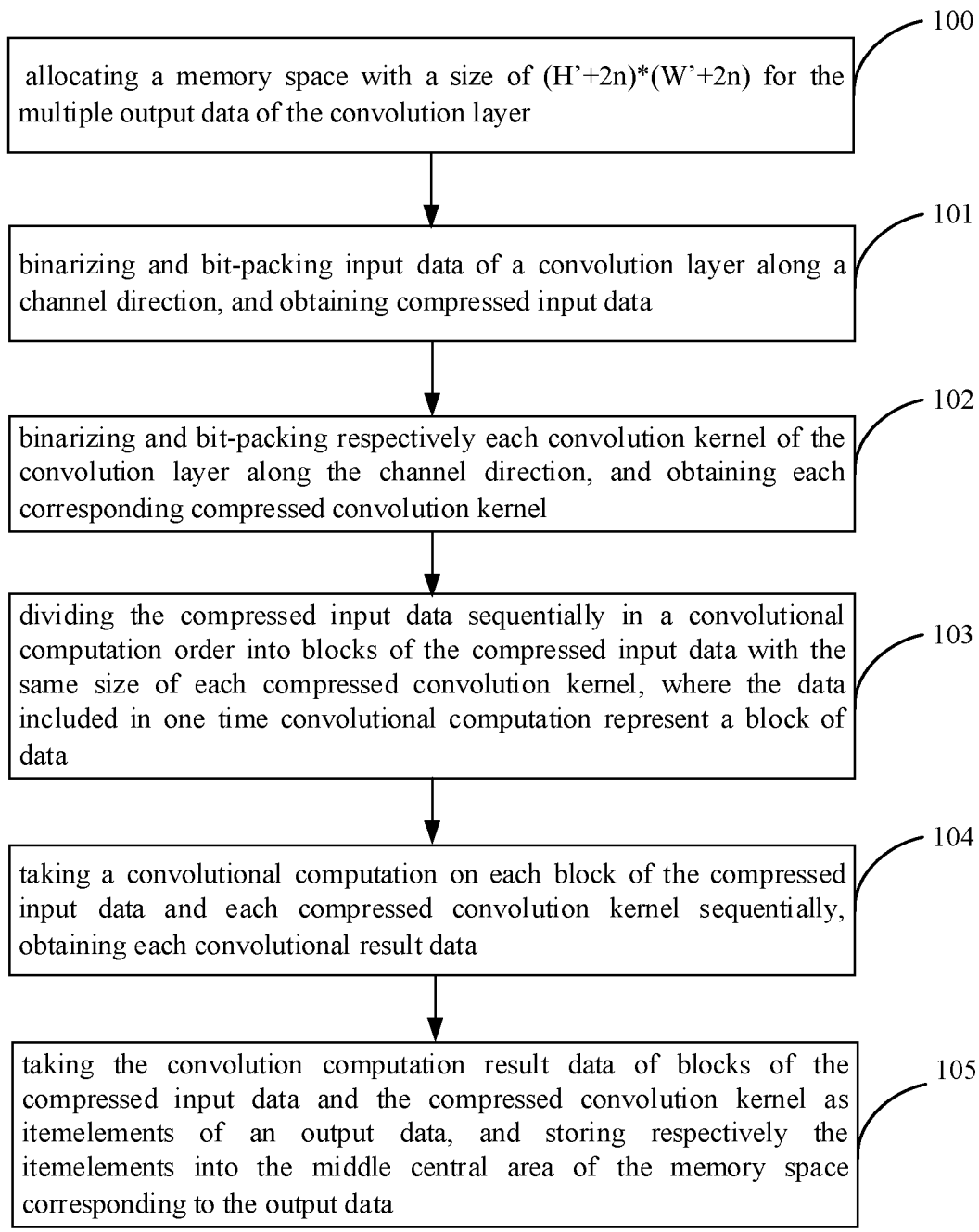
FIG. 5 is second flow diagram of a method for optimizing neural network provided by the embodiments of this application.

In some embodiments of the present application, for solving the problem of padding zero in the margin areas of a matrix, the method illustrated in FIG. 1 may further include a step 100 below, as illustrated in FIG. 5.

Step 100: allocating a memory space with a size of (H'+2n)*(W'+2n) for the multiple output data of the convolution layer, where H' refers the height of the output data, W' refers the width of the output data, and n refers the number of circles to be zero-padded around the output data.

Then, the step 105 described above could be implemented as: taking the convolution computation result data of blocks of the compressed input data and the compressed convolution kernel as elements of an output data, and storing respectively the elements into the central area of the memory space corresponding to the output data.

Figures 6A, 6B:
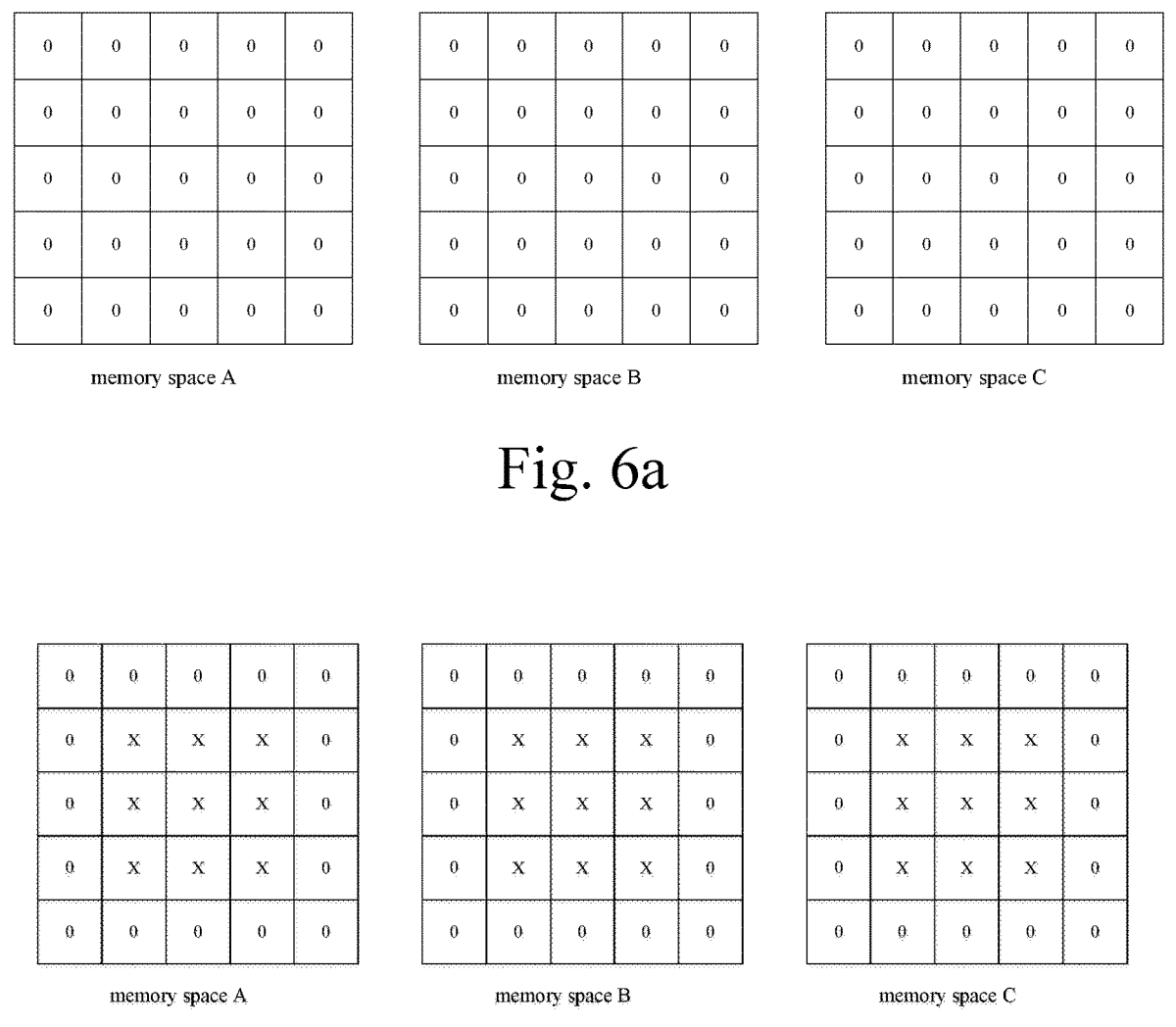

As illustrated in FIG. 6a, assumed that the number of output data of a convolution layer is 3, where the three output data are represented as the first output data, the second output data and the third output data. A memory space is allocated respectively for each of these three output data with a size of (H'+2n)*(W'+2n), which are represented as memory space A, memory space B and memory space C. The initial values of the data stored in the memory space A, the memory space B and the memory space C are zero. The convolution layer includes compressed convolution kernel A, compressed convolution kernel B and compressed convolution kernel C. As illustrated in FIG. 6b, the convolution computation result data of the blocks of the compressed input data and the compressed convolution kernel A represent the first output data, and the first output data are stored in the central area (i.e. the area marked with X) of the corresponding memory space A; the convolution computation result data of the blocks of the compressed input data and the compressed convolution kernel B represent the second output data, and the second output data are stored in the middle area (i.e. the area marked with X) of the corresponding memory space B; and the convolution computation result data of the blocks of the compressed input data and the compressed convolution kernel C represent the third output data, and the third output data are stored in the middle area (i.e. the area marked with X) of the corresponding memory space C. As the size of the first output data is H*W and so do the size of the second output data and the size of the third output data, the values of margin areas of the memory space A, the memory space B and the memory space C are 0, then the effect of zero value of margin areas of the output data could be achieved, further no extra memory cost is added, and no zero-padding operation is needed. Therefore, the problem of padding zero in the margin areas of a matrix could be addressed.

The advantages brought by the scheme of the present application include:

Firstly, neural networks optimized by embodiments of the present application may be more applicable to be used on CPUs for performing real time computation. In practical applications, since the input data of a convolution layer are usually three dimensional data, the convolution kernels of the convolution layer are usually four dimensional data, the number of channels of the layer are extremely large, and if performing convolutional computations of the input data with the convolution kernels, then large computation cost and high latency may be brought. According to technical scheme of the present application, binarizing and bit-packing respectively the input data and each convolution kernel of a convolution layer along a channel direction, and obtaining compressed input data and compressed convolution kernels; then the cost of convolutional computations could be decreased, since the input data and each convolution kernel have been compressed along the channel direction; and the speed of convolutional computations could be improved, since the convolutional computations of the input data and the convolution kernels are performed by unsigned integer-unsigned integer bit-wise operations in the embodiments of the application, and the convolution computations are performed by float point-float point multiplications in the prior art; further, CPUs are good at bit-wise operations, therefore the neural networks optimized by embodiments of the application is more applicable to be used on CPUs for performing real time computations.

Secondly, the technical scheme of embodiments of the application could save memory space and improve computation efficiency. In the prior art a convolutional computation of the input data and the convolution kernels is performed including the following steps: expanding the input data and the convolution kernels to be two dimension matrixes, where the input data and the convolution kernels are two kinds of tensors; multiplying these matrixes, and rearranging the results of the matrix-matrix multiplications to be tensors. By the prior art, on one aspect, extra memory spaces are allocated for storing the expanded matrixes, and memory consumption is increased; on another aspect, since the results of matrix-matrix multiplications are rearranged as tensors, the processing time is increased and the processing speed is decreased. By contrast, in the technical scheme of the present application, the input data are divided directly into blocks of data, the result data of convolutional computations on each data block and each compressed kernel are stored orderly on output tensors, so as to obtain output data. There is no extra memory to be allocated for storing matrixes, and no extra processing time is needed for rearranging the computation result data. Therefore, the technical scheme of embodiments of the application could save memory space and further improve computation efficiency.

In some embodiments of the present application, for improving the optimization effect and further improving the processing effect of the neural networks, the process for fully-connected layers of neural networks is provided. The specific process for fully-connected layers of neural networks is described in detail in the part of the Embodiment Two below.

When a neural network includes convolution layers and does not include a fully-connected layer, the convolution layers could be processed based on the method described in the Embodiment One; when a neural network includes fully-connected layers and does not include a convolution layer, the fully-connected layers could be processed based on the method described in the Embodiment Two below; and when a neural network includes fully-connected layers and convolution layers, the convolution layers could be processed based on the method described in the Embodiment One, and the fully-connected layers could be processed based on the method described in the Embodiment Two below.

Embodiment Two

Figure 7:
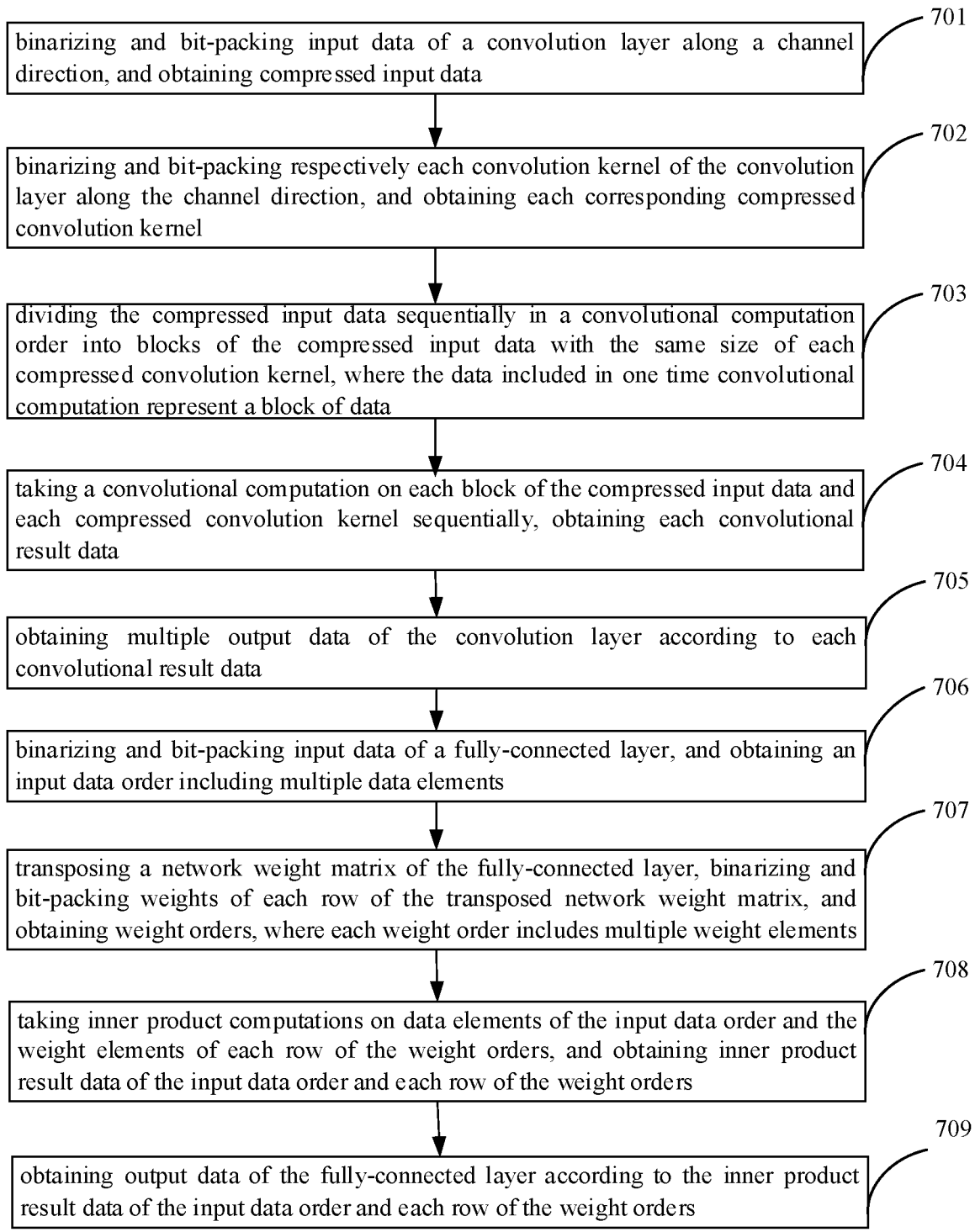
FIG. 7 is third schematic diagram of a method for optimizing neural network provided by the embodiments of this application.

FIG. 7 illustrates a method of optimizing neural network provided by the embodiments of the present application, which including step 701-step 709. Step 701-step 705 illustrate a process for a convolution layer of a neural network, which are corresponding one by one to the step 101-step 105 illustrated in FIG. 1, and the specific embodiments may refer to the Embodiment One and a detailed description thereof will be omitted here. Step 706-step 709 illustrate a process for a fully-connected layer of a neural network. The processing order of step 706-step 709 and step 701-step 705 is not strictly limited, and may be determined according to the structure of the neural network, e.g., when the network layers included in a neural network are convolution layer A, convolution layer B, fully-connected layer C, convolution layer D and fully-connected layer E, the step 701-step 705 are adopted to process each convolution layer, and the step 706-step 708 are adopted to process each fully-connected layer, according to the order of the network layers of the neural network.

Step 701: binarizing and bit-packing input data of a convolution layer along a channel direction, and obtaining compressed input data.

Step 702: binarizing and bit-packing respectively each convolution kernel of the convolution layer along the channel direction, and obtaining each corresponding compressed convolution kernel.

Step 703: dividing the compressed input data sequentially in a convolutional computation order into blocks of the compressed input data with the same size of each compressed convolution kernel, where the data included in one time convolutional computation represent a block of data.

Step 704: taking a convolutional computation on each block of the compressed input data and each compressed convolution kernel sequentially, and obtaining each convolutional result data.

Step 705: obtaining multiple output data of the convolution layer according to each convolutional result data.

Step 706: binarizing and bit-packing input data of a fully-connected layer, and obtaining an input data order including multiple data elements.

Step 707: transposing a network weight matrix of the fully-connected layer, binarizing and bit-packing weights of each row of the transposed network weight matrix, and obtaining weight orders, where each weight order includes multiple weight elements.

Step 708: taking inner product computations on data elements of the input data order and the weight elements of each row of the weight orders, and obtaining inner product result data of the input data order and each row of the weight orders.

Step 709: obtaining output data of the fully-connected layer according to the inner product result data of the input data order and each row of the weight orders.

In some embodiments, the step 706 described above could be implemented as steps E1~E2 described below.

Step E1: binarizing the input data and obtaining binarized input data; and

Step E2: packing every M continuous data elements, from the first data element, of the binarized input data to be a new data element, and obtaining the input data order including multiple data elements, where M is a multiple number of 32.

The value of M is 32, 64, 128, or 256 and so on, and which is not limited strictly in the present application.

Figure 8:
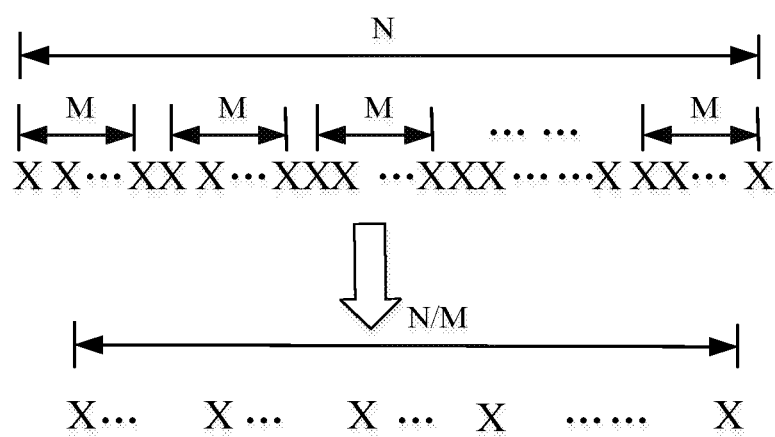
FIG. 8 is a schematic diagram of input data of a full connection layer and the corresponding order of inputting data according to the embodiments of this application.

FIG. 8 is a schematic diagram of the input data of the fully-connected layer and the input data order corresponding to the input data, where the length of the input data is N, and the length of the input data order is N/M.

In some embodiments, in the step 707 described above, the operations of binarizing and bit-packing weights of each row of the transposed network weight matrix and obtaining weight orders could be implemented as step F1~F2 described below.

Step F1: binarizing weights of a row of the transposed network weight matrix, and obtaining binarized weights of the row;

Step F2: bit-packing every M continuous binarized weights, from the first weight, of the row to be a new weight element, and obtaining a weight order including multiple weight elements.

Figure 9A:
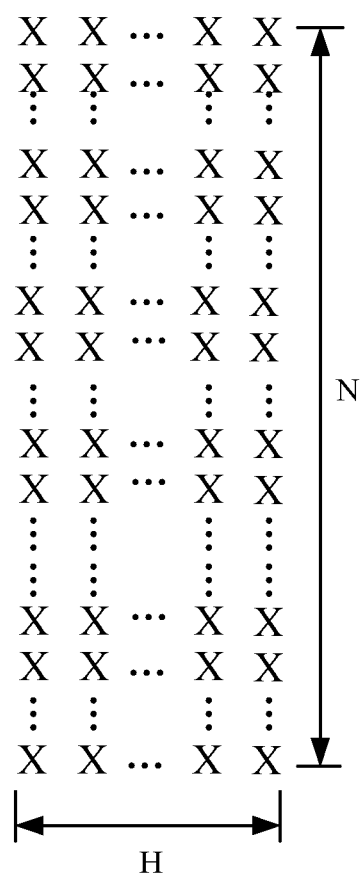
FIG. 9a is schematic diagram of network weights of a fully-connected layer according to the embodiments of this application.
Figure 9B:
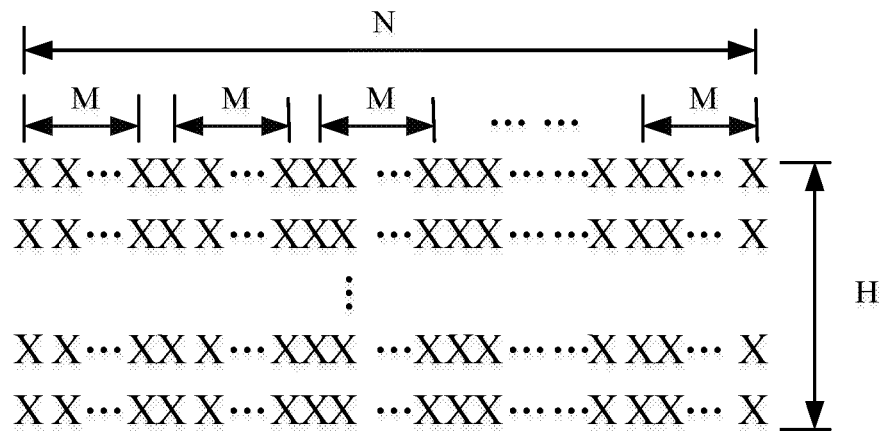
FIG. 9b is a schematic diagram of transposed network weights according to the embodiments of this application.
Figure 9C:
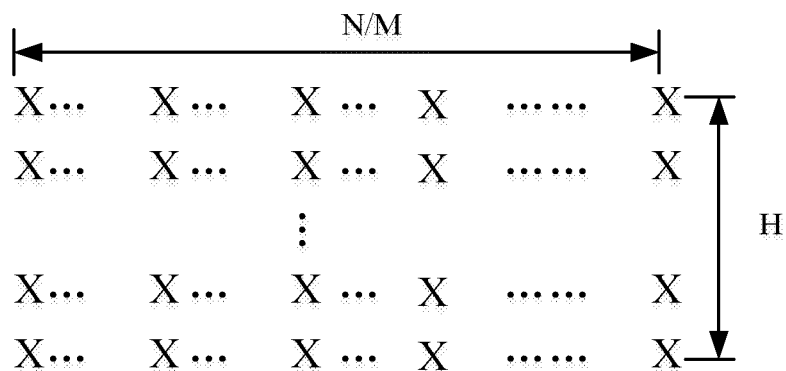
FIG. 9c is a schematic diagram of network weights after binarizing and bit-packing operations according to the embodiments of this application.

FIG. 9a is a schematic diagram of the network weight matrix of a full connection layer, where the network weight matrix includes N rows and H columns, FIG. 9b is a schematic diagram of the transposed network weight matrix, and FIG. 9c is a schematic diagram of the binarized and bit-packed network weight matrix (i.e. weight orders, and each row of the matrix is a weight order).

In some embodiments, the step 708 could implemented as step G1~G2 described below.

Step G1: taking an inner product operation including a XOR operation and a bit-count operation on each weight element in each row of the weight orders and each corresponding data element of the input data order, and obtaining each inner product result data of each weight element and each data element.

Step G2: obtaining inner product result data of the input data order and the row of weight orders, according to each inner product result data of each weight element and the corresponding data element of the row.

The inner product result data of the input data order and the row of weight orders may be obtained based on equation (3) below:

$$X \square W_i = N - 2 \times \left( \sum_{j=1}^{N/M} bitcount(XOR(x_j, w_{ij})) \right) \qquad \text{Equation (3)}$$

In equation (3), $X \square W_i$ refers inner product result data of the input data and the i-th row of the weight orders, X refers the input data order, $W_i$ refers the i-th row of the weight orders, N refers the number of input data, $X_j$ refers the j-th data element of the input data order, $w_{ij}$ refers the j-th weight element of the i-th row of weight orders.

In computer program code, as for the input data order and a row of weight orders, N/M times multiplication and accumulating calculations are needed; and if looping statements are used, looping cost will be increased.

In some embodiments, for saving looping cost, as for the input data order and a row of weight orders, an execution instruction of inner product computation is configured for each pair of data element and weight element involved in convolution computations, i.e., N/M execution instructions of inner product computation are configured, and inner product computations are performed respectively for N/M pairs of data element and weight element according to the N/M execution instructions of inner product computation, and then no looping statement is needed, and looping cost is saved. Therefore, the step 708 described above could include the steps below:

Step G0: configuring an execution instruction of inner product computation corresponding to each weight element of each row of the weight orders;

and then the step G1 described above could be implemented as below: taking an inner product computation operation including a XOR operation and a bit-count operation on a weight element and a corresponding data element, based on an execution instruction corresponding to the weight element, according to the order of the weight element in the row of weight orders.

The value of W dimensions of a full connection layer of a neural network is usually a multiple of 256 (e.g. W=4096 in the first full connection layer of AlexNet, W=25088 in the first full connection layer of VGGNet), and an instruction set with 256 bits length provided by AVX could accelerate multiplications of binarized vectors and matrixes. Then in some embodiments of the present application, packing the input data and weights of a row in 256 bits, i.e. every 256 continuous data elements are packed to be a 256 bits integer, which is supported by AVX; performing an XOR operation bit by bit on two 256 bits length integers; and obtaining the number of 1 in the result of the last step through four times of_mm_popcnt_u64 instructions.

In some embodiments of the present application, for further accelerating speed of the inner product computation of the input data order and each row of the weight orders, taking inner product computations on data elements of the input data order and the weight elements of each row of the weight orders, and obtaining inner product result data of the input data order and each row of the weight orders, comprises: allocating the inner product computations of each row of the weight orders and the input data order to multiple cores of a CPU (Central Processing Unit) and the inner product computations are processed in parallel. Each core of the CPU performs inner product computations described above on the input data order and the rows of the weight orders allocated to the core, and outputs the inner product result data of the inner product computations. For example, assumed that the weight orders include H rows, the CPU includes k cores, and then the H rows could be allocated evenly to the k cores, and the k cores respectively performs inner product computations on the allocated H/k rows of the weight orders and input data order in sequence; or the number of rows corresponding to the loads of cores could be allocated to k cores according to the loads of the k cores; which are not strictly limited in the present application.

In Embodiment Two of the present application, based on the technical advantages brought by processing convolution layers, two advantages could be further brought, including: on the first aspect, by binarizing and bit-packing the input data of a full connection layer of a neural network and a network weight matrix and obtaining input data order and weight orders, data size involved in computations could be greatly reduced since the input data and the network weights are compressed; and computation speed could be improved since the computations on the input data and the network weight matrix by float point-float point multiplications in the prior art is replaced by unsigned integer-unsigned integer bit-wise operations; on the second aspect, by processing each row of transposed network weight matrix as a weight order, the inner product computation operations could be performed in sequence on the input data order and rows of weight orders row by row, and then the data reading speed of matrix-matrix multiplications could be improved, and the speed of inner product computations could be further improved; on the third aspect, when performing convolution computations on the input data order and a row of weigh orders, inner product computation on a data element and a corresponding weight element could be performed according to the execution instruction of inner product computation corresponding to the data element; and then no looping judgement is needed and looping cost may be saved; on the fourth aspect, since the inner product computations on the input data and each row of weight orders are performed in parallel by multiple cores of a CPU, the speed and the efficiency of the inner product computations on the input data order and each row of weight orders could be further improved.

Embodiment Three

Figure 10:
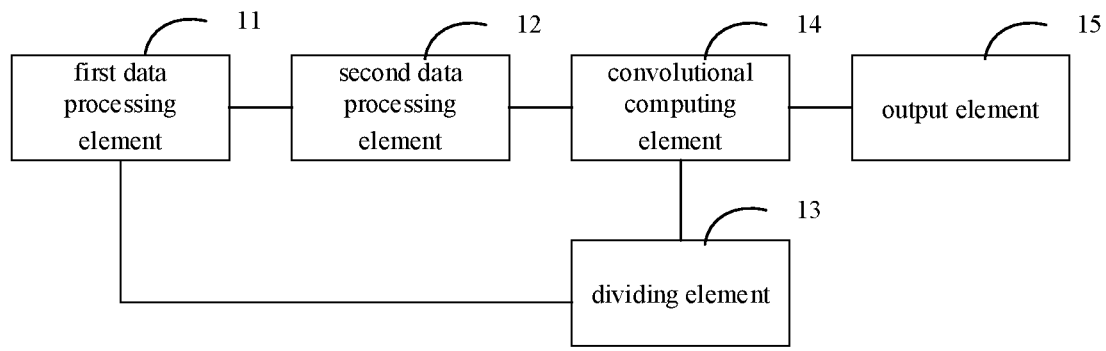
FIG. 10 is a first structure schematic diagram of a device for optimizing neural network provided by the embodiments of this application.

A device of optimizing neural networks is provided in the Embodiment Three of the present application, as illustrated in FIG. 10, based on the same idea of the methods of optimizing neural networks provided in the Embodiment One and the Embodiment Two, including:

a first data processing element 11, configured to binarize and bit-pack input data of a convolution layer along a channel direction, and obtain compressed input data;

a second data processing element 12, configured to binarize and bit-pack respectively each convolution kernel of the convolution layer along the channel direction, and obtain each corresponding compressed convolution kernel;

a dividing element 13, configured to divide the compressed input data sequentially in a convolutional computation order into blocks of the compressed input data with the same size of each compressed convolution kernel, where the data included in one time convolutional computation represent a block of data;

a convolutional computing element 14, configured to take a convolutional computation on each block of the compressed input data and each compressed convolution kernel sequentially, obtaining each convolutional result data;

an output element 15, configured to obtain multiple output data of the convolution layer according to each convolutional result data.

The first processing element 11 and the second processing element 12 described above could be configured to perform the binarzing operation based on the equation (1) described above, and a detailed description thereof will be omitted here.

In some embodiments, the convolutional computing element 14 is specifically configured to take the convolution computation described below for each block of compressed input data and each compressed convolution kernel, where the convolution computation includes:

taking an inner product operation on each channel data of the block of compressed input data and a corresponding channel data of the compressed convolution kernel, and obtaining each inner product result data of each channel data of the block of compressed input data and the corresponding channel data of the compressed convolution kernel; and determining the sum of the inner product result data of all channel data of the block of compressed input data and all the corresponding channel data of the compressed convolution kernel as the convolution result data of the block of compressed input data and the compressed convolution kernel.

Where, the channel data of the block of the compressed input data includes multiple data elements, and the channel data the compressed convolution kernel includes multiple data elements;

the inner product computation of the channel data of the block of compressed input data and the corresponding channel data of the compressed convolution kernel, could be implemented as the following steps:

Performing the steps below for each channel data:

taking an inner product operation including a XOR operation and a bit-count operation on each data element of the channel data of the block of compressed input data and each corresponding data element of the corresponding channel data of the compressed convolution kernel, and obtaining inner product result data of each data element of the channel data of the block of compressed input data and each corresponding data element of the corresponding channel data of the compressed convolution kernel;

obtaining the inner product result data of the channel data of the block of compressed input data and the corresponding channel data of the compressed convolution kernel, according to the inner product result data of each data element of the channel data of the block of compressed input data and each corresponding data element of the corresponding channel data of the compressed convolution kernel.

The inner product result data could be obtained based on the equation (2) described above, and a detailed description thereof will be omitted here.

Figure 11:
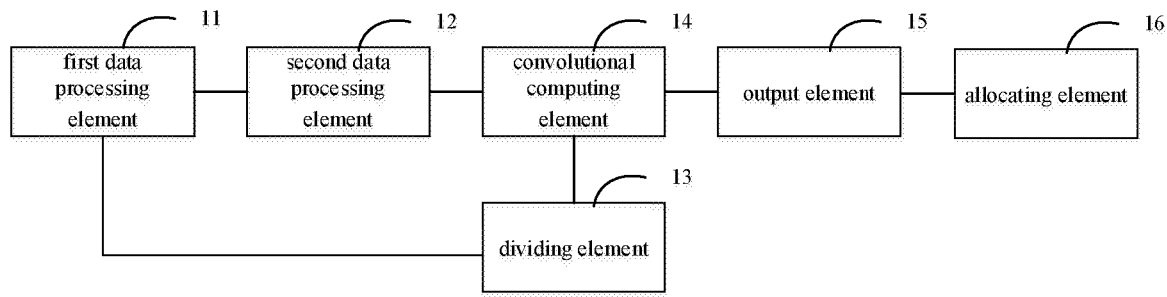
FIG. 11 is a second structure schematic diagram of a device for optimizing neural network provided by the embodiments of this application.

In some embodiments, the device could further include a allocating element 16, as illustrated in FIG. 11:

The allocating element 16 is configured to allocate a memory space with a size of (H'+2n)*(W'+2n) for the multiple output data of the convolution layer, where H' refers the height of the output data, W' refers the width of the output data, and n refers the number of circles to be zero-padded around the output data.

The output element 15 is specifically configured to taking the convolution computation result data of blocks of the compressed input data and the compressed convolution kernel as elements of an output data, and storing respectively the elements into the central area of the memory space corresponding to the output data.

In some embodiments, the first processing element 11 is specifically configured to binarize the input data of the convolution layer along the channel direction and obtaining binarized input data; and pack every M continuous data elements, from the first data element, of the binarized input data along the channel direction to be a new data element, where the M is a number of an integer multiple of 32.

In some embodiments, the second processing element 12 is specifically configured to, for each convolution kernel, binarize the convolution kernel along the channel direction and obtain a binarized convolution kernel; and pack every M continuous data elements, from the first data element, of the binarized convolution kernel along the channel direction to be a new data element.

Figure 12:
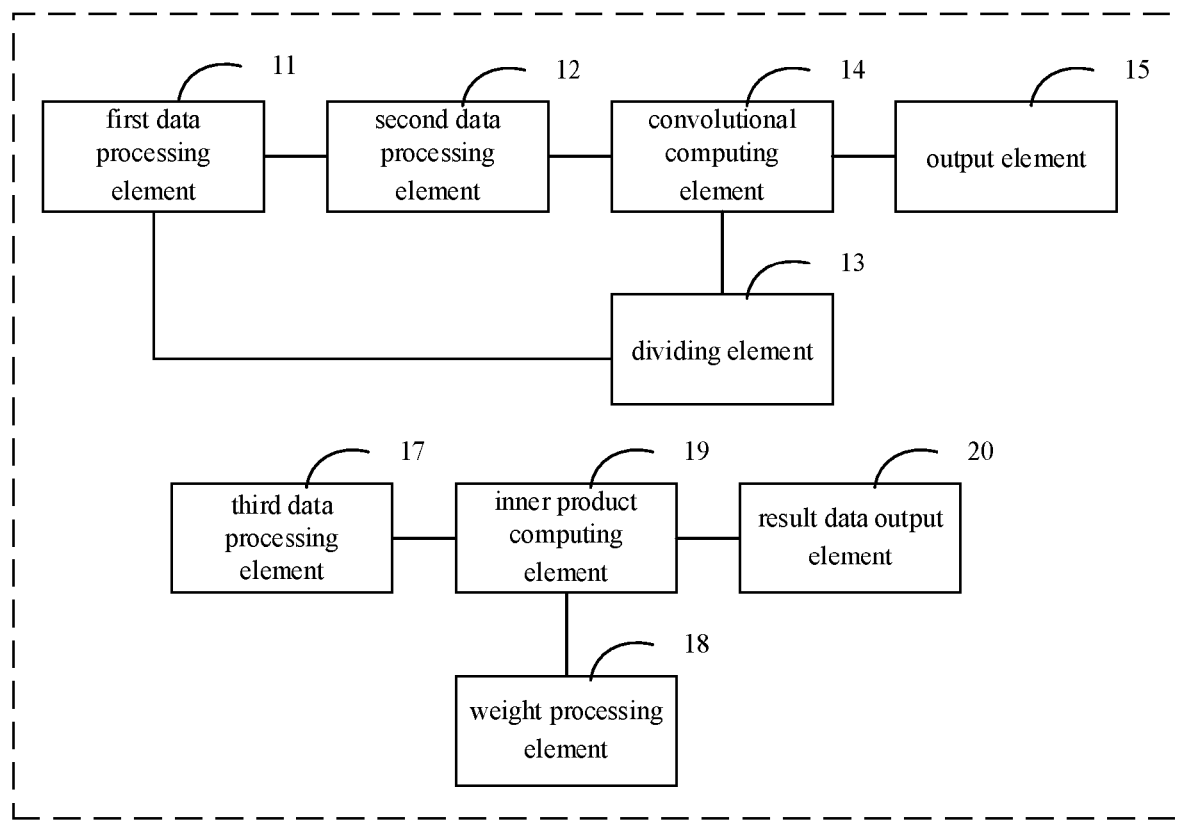
FIG. 12 is a third structure schematic diagram of a device for optimizing neural network provided by the embodiments of this application.

In some embodiments, based on the devices illustrated in FIG. 10 and FIG. 11, a device as illustrated in FIG. 12 could further include a third data processing element 17, a weight processing element 18, an inner product computing element 19, and a result data output element 20, where:

the third data processing element 17 is configured to binarize and bit-pack input data of a fully-connected layer, and obtain an input data order including multiple data elements;

the weight processing element 18 is configured to transpose a network weight matrix of the fully-connected layer, binarize and bit-pack weights of each row of the transposed network weight matrix, and obtain weight orders, where each weight order includes multiple weight elements;

the inner product computing element 19 is configured to take inner product computations on data elements of the input data order and the weight elements of each row of the weight orders, and obtain inner product result data of the input data order and each row of the weight orders; and, the result data output element 20 is configured to obtain output data of the fully-connected layer according to the inner product result data of the input data order and each row of the weight orders.

In some embodiments, the inner product computing element 19 further includes:

an inner product computing module configured to take an inner product operation including a XOR operation and a bit-count operation on each weight element in each row of the weight orders and each corresponding data element of the input data order, and obtain each inner product result data of each weight element and each data element; and, a determining module configured to obtain inner product result data of the input data order and the row of weight orders, according to each inner product result data of each weight element and the corresponding data element of the row.

Where the inner product result data of the input data order and the row of weight orders could be obtained based on the equation (3) described above, and a detailed description thereof will be omitted here.

In some embodiments, for saving looping cost, the inner product computing element 19 could further include:

an instruction configuration module, configured to configure an execution instruction of inner product computation corresponding to each weight element of each row of the weight orders; and, the inner product computing module is specifically configured to take an inner product computation operation including a XOR operation and a bit-count operation on a weight element and a corresponding data element, based on an execution instruction corresponding to the weight element, according to the order of the weight element in the row of weight orders.

In some embodiments, the inner product computing element 19 is specifically configured to allocate the inner product computations of each row of the weight orders and the input data order to multiple cores of the CPU and the inner product computations are processed in parallel, and the result data of the inner product computations are obtained from the multiple cores.

In some embodiments, the third data processing element 17 is specifically configured to binarize the input data and obtaining binarized input data; and pack every M continuous data elements, from the first data element, of the binarized input data to be a new data element, and obtain the input data order including multiple data elements, where M is a multiple number of 32.

In some embodiments, the weight processing element 18 is specifically configured to binarize weights of a row of the transposed network weight matrix, and obtain binarized weights of the row; and, bit-pack every M continuous binarized weights, from the first weight, of the row to be a new weight element, and obtaining a weight order including multiple weight elements.

Embodiment Four

Figure 13:
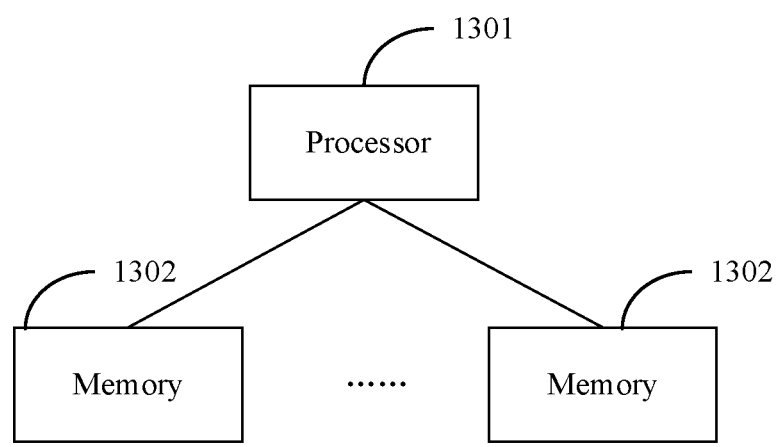
FIG. 13 is a fourth structure schematic diagram of a device for optimizing neural network provided by the embodiments of this application.

A device of optimizing neural networks is provided in the Embodiment Four of the present application, as illustrated in FIG. 13, based on the same idea of the methods of optimizing neural networks provided in the Embodiment One and the Embodiment Two, including:

a processor 1301 and at least one memory 1302, the at least one memory 1302 storing at least one machine executable instruction, and the processor 1301 is configured to read the at least one machine executable instruction to perform the process of:

binarizing and bit-packing input data of a convolution layer along a channel direction, and obtaining compressed input data;

binarizing and bit-packing respectively each convolution kernel of the convolution layer along the channel direction, and obtaining each corresponding compressed convolution kernel;

dividing the compressed input data sequentially in a convolutional computation order into blocks of the compressed input data with the same size of each compressed convolution kernel, where the data included in one time convolutional computation represent a block of data; and taking a convolutional computation on each block of the compressed input data and each compressed convolution kernel sequentially, obtaining each convolutional result data, and obtaining multiple output data of the convolution layer according to each convolutional result data.

In some embodiments, the processor 1301 executes the at least one machine executable instruction to perform the process of taking a convolutional computation on each block of the compressed input data and each compressed convolution kernel sequentially, obtaining each convolutional result data, includes:

taking the convolution computation on each block of compressed input data and each compressed convolution kernel, where the convolution computation includes:

taking an inner product operation on each channel data of the block of compressed input data and a corresponding channel data of the compressed convolution kernel, and obtaining each inner product result data of each channel data of the block of compressed input data and the corresponding channel data of the compressed convolution kernel; and determining the sum of the inner product result data of all channel data of the block of compressed input data and all the corresponding channel data of the compressed convolution kernel as the convolution result data of the block of compressed input data and the compressed convolution kernel.

In embodiments of the present application, the channel data of the block of the compressed input data comprise multiple data elements, and the channel data of the compressed convolution kernel comprise multiple data elements;

the processor executes the at least one machine executable instruction to perform the process of taking an inner product operation on each channel data of the block of the compressed input data and a corresponding channel data of the compressed convolution kernel, includes:

performing the steps below for each channel data of the block of the compressed input data:

taking an inner product operation including a XOR operation and a bit-count operation on each data element of the channel data of the block of compressed input data and each corresponding data element of the corresponding channel data of the compressed convolution kernel, and obtaining inner product result data of each data element of the channel data of the block of compressed input data and each corresponding data element of the corresponding channel data of the compressed convolution kernel; and obtaining the inner product result data of the channel data of the block of compressed input data and the corresponding channel data of the compressed convolution kernel, according to the inner product result data of each data element of the channel data of the block of compressed input data and each corresponding data element of the corresponding channel data of the compressed convolution kernel.

In some embodiments, the processor 1301 executes the at least one machine executable instruction to further perform the process of:

allocating a memory space with a size of (H'+2n)*(W'+2n) for the multiple output data of the convolution layer, where H' refers the height of the output data, W' refers the width of the output data, and n refers the number of circles to be zero-padded around the output data; and the processor 1301 executes the at least one machine executable instruction to perform the process of obtaining multiple output data of the convolution layer according to each convolutional result data, includes: taking the convolution computation result data of blocks of the compressed input data and the compressed convolution kernel as elements of an output data, and storing respectively the elements into the central area of the memory space corresponding to the output data.

In some embodiments, the processor 1301 executes the at least one machine executable instruction to perform the process of binarizing and bit-packing input data of a convolution layer along a channel direction, and obtaining compressed input data, includes: binarizing the input data of the convolution layer along the channel direction and obtaining binarized input data; and packing every M continuous data elements, from the first data element, of the binarized input data along the channel direction to be a new data element, where the M is a number of an integer multiple of 32; and the processor 1301 executes the at least one machine executable instruction to perform the process of binarizing and bit-packing respectively each convolution kernel of the convolution layer along the channel direction, and obtaining each corresponding compressed convolution kernel, includes: for each convolution kernel, binarizing the convolution kernel along the channel direction and obtaining a binarized convolution kernel; and packing every M continuous data elements, from the first data element, of the binarized convolution kernel along the channel direction to be a new data element.

In some embodiments, the processor 1301 executes the at least one machine executable instruction to further perform the process of:

binarizing and bit-packing input data of a fully-connected layer, and obtaining an input data order including multiple data elements;

transposing a network weight matrix of the fully-connected layer, binarizing and bit-packing weights of each row of the transposed network weight matrix, and obtaining weight orders, where each weight order includes multiple weight elements;

taking inner product computations on data elements of the input data order and the weight elements of each row of the weight orders, and obtaining inner product result data of the input data order and each row of the weight orders; and obtaining output data of the fully-connected layer according to the inner product result data of the input data order and each row of the weight orders.

In some embodiments, the processor executes the at least one machine executable instruction to perform the process of taking inner product computations on data elements of the input data order and the weight elements of each row of the weight orders, and obtaining inner product result data of the input data order and each row of the weight orders, includes:

taking an inner product operation including a XOR operation and a bit-count operation on each weight element in each row of the weight orders and each corresponding data element of the input data order, and obtaining each inner product result data of each weight element and each data element; and obtaining inner product result data of the input data order and the row of weight orders, according to each inner product result data of each weight element and the corresponding data element of the row.

In some embodiments, before the processor 1301 executes the at least one machine executable instruction to perform the process of taking an inner product operation including a XOR operation and a bit-count operation on each weight element in each row of the weight orders and each corresponding data element of the input data order, and obtaining each inner product result data of each weight element and each data element, the processor 1301 executes the at least one machine executable instruction to further perform the process of:

configuring an execution instruction of inner product computation corresponding to each weight element of each row of the weight orders; then the processor 1301 executes the at least one machine executable instruction to perform the process of taking an inner product operation including a XOR operation and a bit-count operation on each weight element in each row of the weight orders and each corresponding data element of the input data order, includes:

taking an inner product computation operation including a XOR operation and a bit-count operation on a weight element and a corresponding data element, based on an execution instruction corresponding to the weight element, according to the order of the weight element in the row of weight orders.

In some embodiments, the processor 1301 executes the at least one machine executable instruction to perform the process of taking inner product computations on data elements of the input data order and the weight elements of each row of the weight orders, and obtaining inner product result data of the input data order and each row of the weight orders, includes:

allocating the inner product computations of each row of the weight orders and the input data order to multiple cores of a CPU and the inner product computations are processed in parallel, and obtaining the inner product result data of the input data order and each row of the weight orders from the multiple cores of the CPU.

In some embodiments, the processor executes the at least one machine executable instruction to perform the process of binarizing and bit-packing input data of a fully-connected layer, and obtaining an input data order including multiple data elements, includes: binarizing the input data and obtaining binarized input data; and packing every M continuous data elements, from the first data element, of the binarized input data to be a new data element, and obtaining the input data order including multiple data elements, where M is a multiple number of 32; and the processor 1301 executes the at least one machine executable instruction to perform the process of binarizing and bit-packing weights of each row of the transposed network weight matrix and obtaining weight orders, includes: binarizing weights of a row of the transposed network weight matrix, and obtaining binarized weights of the row; and bit-packing every M continuous binarized weights, from the first weight, of the row to be a new weight element, and obtaining a weight order including multiple weight elements.

It should be understood by those skilled in the art that the embodiments of the present application can provide methods, systems and computer program products. Thus the present application can take the form of hardware embodiments alone, application software embodiments alone, or embodiments combining the application software and hardware aspects. Also the present application can take the form of computer program products implemented on one or more computer usable storage mediums (including but not limited to magnetic disk memories, CD-ROMs, optical memories and the like) containing computer usable program codes therein.

The present application is described by reference to the flow charts and/or the box diagrams of the methods, the devices (systems) and the computer program products according to the embodiments of the present application. It should be understood that each process and/or box in the flow charts and/or the box diagrams, and a combination of processes and/or blocks in the flow charts and/or the box diagrams can be implemented by the computer program instructions. These computer program instructions can be provided to a general-purpose computer, a dedicated computer, an embedded processor, or a processor of another programmable data processing device to produce a machine, so that an apparatus for implementing the functions specified in one or more processes of the flow charts and/or one or more blocks of the box diagrams is produced by the instructions executed by the computer or the processor of another programmable data processing device.

These computer program instructions can also be stored in a computer readable memory which is capable of guiding the computer or another programmable data processing device to operate in a particular way, so that the instructions stored in the computer readable memory produce a manufacture including the instruction apparatus which implements the functions specified in one or more processes of the flow charts and/or one or more blocks of the box diagrams.

These computer program instructions can also be loaded onto the computer or another programmable data processing device, so that a series of operation steps are performed on the computer or another programmable device to produce the computer-implemented processing. Thus the instructions executed on the computer or another programmable device provide steps for implementing the functions specified in one or more processes of the flow charts and/or one or more blocks of the box diagrams.

Although the preferred embodiments of the present application have been described, those skilled in the art can make additional alterations and modifications to these embodiments once they learn about the basic creative concepts.

Thus the attached claims are intended to be interpreted to include the preferred embodiments as well as all the alterations and modifications falling within the scope of the present application.

Evidently those skilled in the art can make various modifications and variations to the present application without departing from the spirit and scope of the present application. Thus the present application is also intended to encompass these modifications and variations therein as long as these modifications and variations to the present application come into the scope of the claims of the present application and their equivalents.

What is claimed is:

1. A method for optimizing neural network, implemented by a device comprising at least a processor and a memory, comprising:
    binarizing, by the processor, and bit-packing input data of a convolution layer along a channel direction, and obtaining compressed input data;
    binarizing and bit-packing respectively, by the processor, each convolution kernel of the convolution layer along the channel direction, and obtaining each corresponding compressed convolution kernel;
    dividing, by the processor, the compressed input data sequentially in a convolutional computation order into blocks of the compressed input data with a same size of each compressed convolution kernel, wherein the data included in one time convolutional computation represent a block of data;
    taking, by the processor, a convolutional computation on each block of the compressed input data and each compressed convolution kernel sequentially, obtaining each convolutional result data;
    allocating, by the processor, from the memory, a memory space with a size of (H'+2n)*(W'+2n) for multiple output data of the convolution layer, wherein H' refers to a height of the output data, W' refers a width of the output data, and n refers a number of circles to be zero-padded around the output data;
    obtaining, by the processor, the multiple output data of the convolution layer according to each convolutional result data; and
    storing the multiple output data to the memory space.

2. The method according to claim 1, wherein the taking the convolutional computation on each block of the compressed input data and each compressed convolution kernel sequentially, and the obtaining each convolutional result data, comprises:
    taking the convolutional computation on each block of compressed input data and each compressed convolution kernel, wherein the convolutional computation comprises:
    taking an inner product operation on each channel data of the block of compressed input data and a corresponding channel data of the compressed convolution kernel, and obtaining each inner product result data of each channel data of the block of compressed input data and the corresponding channel data of the compressed convolution kernel; and
    determining a sum of the inner product result data of all channel data of the block of compressed input data and all the corresponding channel data of the compressed convolution kernel as the convolution result data of the block of compressed input data and the compressed convolution kernel.

3. The method according to claim 2,
    wherein the channel data of the block of the compressed input data comprises multiple data elements, and the channel data of the compressed convolution kernel comprises multiple data elements;
    wherein the taking the inner product operation on each channel data of the block of the compressed input data and the corresponding channel data of the compressed convolution kernel, comprises:
    performing, for each channel data of the block of the compressed input data:
    taking an inner product operation including an XOR operation and a bit-count operation on each data element of the channel data of the block of compressed input data and each corresponding data element of the corresponding channel data of the compressed convolution kernel, and obtaining inner product result data of each data element of the channel data of the block of compressed input data and each corresponding data element of the corresponding channel data of the compressed convolution kernel; and
    obtaining the inner product result data of the channel data of the block of compressed input data and the corresponding channel data of the compressed convolution kernel, according to the inner product result data of each data element of the channel data of the block of compressed input data and each corresponding data element of the corresponding channel data of the compressed convolution kernel.

4. The method according to claim 1, wherein the binarizing and the bit-packing input data of the convolution layer along the channel direction, and the obtaining compressed input data, comprises:
    binarizing the input data of the convolution layer along the channel direction and obtaining binarized input data;
    packing every M continuous data elements, from a first data element, of the binarized input data along the channel direction to be a new data element, wherein the M is a number of an integer multiple of 32; and
    binarizing and bit-packing respectively each convolution kernel of the convolution layer along the channel direction, and obtaining each corresponding compressed convolution kernel, by:
    for each convolution kernel, binarizing the convolution kernel along the channel direction and obtaining a binarized convolution kernel; and packing every M continuous data elements, from the first data element, of the binarized convolution kernel along the channel direction to be a new data element.

5. The method according to claim 1, further comprises:
    binarizing and bit-packing input data of a fully-connected layer, and obtaining input data order including multiple data elements;
    transposing a network weight matrix of the fully-connected layer, binarizing and bit-packing weights of each row of the transposed network weight matrix, and obtaining weight orders, wherein each weight order includes multiple weight elements;
    taking inner product computations on data elements of the input data order and the weight elements of each row of the weight orders, and obtaining inner product result data of the input data order and each row of the weight orders; and
    obtaining output data of the fully-connected layer according to the inner product result data of the input data order and each row of the weight orders.

6. The method according to claim 5, wherein the taking inner product computations on the data elements of the input data order and the weight elements of each row of the weight orders, and the obtaining inner product result data of the input data order and each row of the weight orders, comprises:

taking an inner product operation including an XOR operation and a bit-count operation on each weight element in each row of the weight orders and each corresponding data element of the input data order, and obtaining each inner product result data of each weight element and each data element; and obtaining inner product result data of the input data order and the row of weight orders, according to each inner product result data of each weight element and the corresponding data element of the row.

7. The method according to claim 6, wherein before the operation of taking the inner product operation including the XOR operation and the bit-count operation on each weight element in each row of the weight orders and each corresponding data element of the input data order, and the obtaining each inner product result data of each weight element and each data element, the method further comprises:

configuring an execution instruction of inner product computation corresponding to each weight element of each row of the weight orders; and wherein the taking the inner product operation including the XOR operation and the bit-count operation on each weight element in each row of the weight orders and each corresponding data element of the input data order, comprises:

taking an inner product computation operation including a XOR operation and a bit-count operation on a weight element and a corresponding data element, based on an execution instruction corresponding to the weight element, according to the order of the weight element in the row of weight orders.

8. The method according to claim 6, wherein the taking inner product computations on data elements of the input data order and the weight elements of each row of the weight orders, and the obtaining inner product result data of the input data order and each row of the weight orders, comprises:

allocating the inner product computations of each row of the weight orders and the input data order to multiple cores of a CPU and the inner product computations are processed in parallel, and obtaining the inner product result data of the input data order and each row of the weight orders from the multiple cores of the CPU.

9. The method according to claim 5, wherein the binarizing and the bit-packing input data of the fully-connected layer, and the obtaining an input data order including multiple data elements, comprises:

binarizing the input data and obtaining binarized input data; and packing every M continuous data elements, from a first data element, of the binarized input data to be a new data element, and obtaining the input data order including multiple data elements, wherein M is a multiple number of 32; and binarizing and bit-packing weights of each row of the transposed network weight matrix and obtaining weight orders, comprises: binarizing weights of a row of the transposed network weight matrix, and obtaining binarized weights of the row; and bit-packing every M continuous binarized weights, from a first weight, of the row to be a new weight element, and obtaining a weight order including multiple weight elements.

10. A device for optimizing neural network, comprising a processor and at least one memory, the at least one memory storing at least one machine executable instruction, and the processor is configured to read the at least one machine executable instruction to be configured to perform a process of:

binarizing and bit-packing input data of a convolution layer along a channel direction, and obtaining compressed input data;

binarizing and bit-packing respectively each convolution kernel of the convolution layer along the channel direction, and obtaining each corresponding compressed convolution kernel;

dividing the compressed input data sequentially in a convolutional computation order into blocks of the compressed input data with a same size of each compressed convolution kernel, wherein the data included in one time convolutional computation represent a block of data; and taking a convolutional computation on each block of the compressed input data and each compressed convolution kernel sequentially, obtaining each convolutional result data;

allocating, from the memory, a memory space with a size of $(H'+2n)*(W'+2n)$ for multiple output data of the convolution layer, wherein H' refers to a height of the output data, W' refers to a width of the output data, and n refers to a number of circles to be zero-padded around the output data;

obtaining the multiple output data of the convolution layer according to each convolutional result data; and storing the multiple output data to the memory space.

11. The device according to claim 10, wherein the processor is configured to execute the at least one machine executable instruction to perform the taking the convolutional computation on each block of the compressed input data and each compressed convolution kernel sequentially, and the obtaining each convolutional result data by having the processor being configured to perform the process that comprises:

taking the convolutional computation on each block of compressed input data and each compressed convolution kernel, wherein the convolutional computation comprises:

taking an inner product operation on each channel data of the block of compressed input data and a corresponding channel data of the compressed convolution kernel, and obtaining each inner product result data of each channel data of the block of compressed input data and the corresponding channel data of the compressed convolution kernel; and determining a sum of the inner product result data of all channel data of the block of compressed input data and all the corresponding channel data of the compressed convolution kernel as the convolution result data of the block of compressed input data and the compressed convolution kernel.

12. The device according to claim 11, wherein the channel data of the block of the compressed input data comprise multiple data elements, and the channel data of the compressed convolution kernel comprise multiple data elements; and wherein the processor is configured to execute the at least one machine executable instruction to perform the taking the inner product operation on each channel data of the block of the compressed input data and the corresponding channel data of the compressed convolution kernel by having the processor being configured to perform the process that comprises:

performing, for each channel data of the block of the compressed input data:
- taking an inner product operation including an XOR operation and a bit-count operation on each data element of the channel data of the block of compressed input data and each corresponding data element of the corresponding channel data of the compressed convolution kernel, and obtaining inner product result data of each data element of the channel data of the block of compressed input data and each corresponding data element of the corresponding channel data of the compressed convolution kernel; and
- obtaining the inner product result data of the channel data of the block of compressed input data and the corresponding channel data of the compressed convolution kernel, according to the inner product result data of each data element of the channel data of the block of compressed input data and each corresponding data element of the corresponding channel data of the compressed convolution kernel.

13. The device according to claim 10, wherein the processor is configured to execute the at least one machine executable instruction to perform the binarizing and the bit-packing input data of the convolution layer along the channel direction, and the obtaining compressed input data by having the processor being configured to perform the process that comprises:
- binarizing the input data of the convolution layer along the channel direction and obtaining binarized input data;
- packing every M continuous data elements, from a first data element, of the binarized input data along the channel direction to be a new data element, wherein the M is a number of an integer multiple of 32; and
- the processor executes the at least one machine executable instruction to perform the process of binarizing and bit-packing respectively each convolution kernel of the convolution layer along the channel direction, and obtaining each corresponding compressed convolution kernel, comprises:
- for each convolution kernel, binarizing the convolution kernel along the channel direction and obtaining a binarized convolution kernel; and packing every M continuous data elements, from the first data element, of the binarized convolution kernel along the channel direction to be a new data element.

14. The device according to claim 10, wherein the processor is configured to execute the at least one machine executable instruction to further perform the process of:
- binarizing and bit-packing input data of a fully-connected layer, and obtaining an input data order including multiple data elements;
- transposing a network weight matrix of the fully-connected layer, binarizing and bit-packing weights of each row of the transposed network weight matrix, and obtaining weight orders, wherein each weight order includes multiple weight elements;
- taking inner product computations on data elements of the input data order and the weight elements of each row of the weight orders, and obtaining inner product result data of the input data order and each row of the weight orders; and
- obtaining output data of the fully-connected layer according to the inner product result data of the input data order and each row of the weight orders.

15. The device according to claim 14, wherein the processor is configured to execute the at least one machine executable instruction to perform the taking inner product computations on the data elements of the input data order and the weight elements of each row of the weight orders, and the obtaining inner product result data of the input data order and each row of the weight orders by having the processor being configured to perform the process that comprises:
- taking an inner product operation including a XOR operation and a bit-count operation on each weight element in each row of the weight orders and each corresponding data element of the input data order, and obtaining each inner product result data of each weight element and each data element; and
- obtaining inner product result data of the input data order and the row of weight orders, according to each inner product result data of each weight element and the corresponding data element of the row.

16. The device according to claim 15, wherein the processor is configured to execute the at least one machine executable instruction to perform the taking the inner product operation including the XOR operation and the bit-count operation on each weight element in each row of the weight orders and each corresponding data element of the input data order, and the obtaining each inner product result data of each weight element and each data element, after:
- configuring an execution instruction of inner product computation corresponding to each weight element of each row of the weight orders; and
- wherein the processor is configured to execute the at least one machine executable instruction to perform the taking the inner product operation including the XOR operation and the bit-count operation on each weight element in each row of the weight orders and each corresponding data element of the input data order by having the processor being configured to perform the process that comprises:
- taking an inner product computation operation including a XOR operation and a bit-count operation on a weight element and a corresponding data element, based on an execution instruction corresponding to the weight element, according to the order of the weight element in the row of weight orders.

17. The device according to claim 15, wherein the processor is configured to execute the at least one machine executable instruction to perform the taking inner product computations on data elements of the input data order and the weight elements of each row of the weight orders, and the obtaining inner product result data of the input data order and each row of the weight orders by having the processor being configured to perform the process that comprises:
- allocating the inner product computations of each row of the weight orders and the input data order to multiple cores of a CPU and the inner product computations are processed in parallel, and obtaining the inner product result data of the input data order and each row of the weight orders from the multiple cores of the CPU.

18. A non-transitory computer readable memory having instructions stored thereon, the instructions, when executed by a processor, causes the processor to implement a method for optimizing neural network, comprising:

binarizing and bit-packing input data of a convolution layer along a channel direction, and obtaining compressed input data;

binarizing and bit-packing respectively each convolution kernel of the convolution layer along the channel direction, and obtaining each corresponding compressed convolution kernel;

dividing the compressed input data sequentially in a convolutional computation order into blocks of the compressed input data with a same size of each compressed convolution kernel, wherein the data included in one time convolutional computation represent a block of data;

taking a convolutional computation on each block of the compressed input data and each compressed convolution kernel sequentially, obtaining each convolutional result data;

allocating from a memory, a memory space with a size of $(H'+2n)*(W'+2n)$ for multiple output data of the convolution layer, wherein H' refers to a height of the output data, W' refers to a width of the output data, and n refers to a number of circles to be zero-padded around the output data;

obtaining the multiple output data of the convolution layer according to each convolutional result data; and storing the multiple output data to the memory space.

19. The non-transitory computer readable memory according to claim 18, wherein the taking the convolutional computation on each block of the compressed input data and each compressed convolution kernel sequentially, and the obtaining each convolutional result data, comprises:

taking the convolutional computation on each block of compressed input data and each compressed convolution kernel, wherein the convolutional computation comprises:

taking an inner product operation on each channel data of the block of compressed input data and a corresponding channel data of the compressed convolution kernel, and obtaining each inner product result data of each channel data of the block of compressed input data and the corresponding channel data of the compressed convolution kernel; and determining a sum of the inner product result data of all channel data of the block of compressed input data and all the corresponding channel data of the compressed convolution kernel as the convolution result data of the block of compressed input data and the compressed convolution kernel.

20. The non-transitory computer readable memory according to claim 19, wherein the channel data of the block of the compressed input data comprise multiple data elements, and the channel data of the compressed convolution kernel comprise multiple data elements;

wherein the taking the inner product operation on each channel data of the block of the compressed input data and the corresponding channel data of the compressed convolution kernel, comprises:

performing for each channel data of the block of the compressed input data:

taking an inner product operation including a XOR operation and a bit-count operation on each data element of the channel data of the block of compressed input data and each corresponding data element of the corresponding channel data of the compressed convolution kernel, and obtaining inner product result data of each data element of the channel data of the block of compressed input data and each corresponding data element of the corresponding channel data of the compressed convolution kernel; and obtaining the inner product result data of the channel data of the block of compressed input data and the corresponding channel data of the compressed convolution kernel, according to the inner product result data of each data element of the channel data of the block of compressed input data and each corresponding data element of the corresponding channel data of the compressed convolution kernel.

* * * * *

UNITED STATES PATENT AND TRADEMARK OFFICE
CERTIFICATE OF CORRECTION

PATENT NO. : 11,580,377 B2
APPLICATION NO. : 16/014869
DATED : February 14, 2023
INVENTOR(S) : Yuwei Hu et al.

It is certified that error appears in the above-identified patent and that said Letters Patent is hereby corrected as shown below:

On the Title Page

1. In Item (73), under "Assignees", in Column 1, Line 1, delete "TU SIMPLE," and insert -- TUSIMPLE, --, therefor.

In the Specification

2. In Column 6, Line 12, delete "C3~C2:" and insert -- C1~C2: --, therefor.

3. In Column 6, Line 38, delete "D1-D2" and insert -- D1~D2 --, therefor.

4. In Column 7, Line 1, delete "X□Wi" and insert -- Xi□Wi --, therefor.

5. In Column 7, Line 2, delete "Xi, and Wi, Xi," and insert -- Xi and Wi, Xi --, therefor.

6. In Column 7, Line 5, delete "xy" and insert -- xij --, therefor.

7. In Column 9, Line 23, delete "701-step" and insert -- 701~step --, therefor.

8. In Column 9, Line 23, delete "701-step" and insert -- 701~step --, therefor.

9. In Column 9, Line 25, delete "101-step" and insert -- 101~step --, therefor.

10. In Column 9, Line 28, delete "706-step" and insert -- 706~step --, therefor.

11. In Column 9, Line 30, delete "706-step" and insert -- 706~step --, therefor.

12. In Column 9, Line 30, delete "701-step" and insert -- 701~step --, therefor.

13. In Column 9, Line 35, delete "701-step" and insert -- 701~step --, therefor.

Signed and Sealed this
Eighteenth Day of April, 2023

Katherine Kelly Vidal
*Director of the United States Patent and Trademark Office*

CERTIFICATE OF CORRECTION (continued)
U.S. Pat. No. 11,580,377 B2

14. In Column 9, Line 37, delete "706-step" and insert -- 706~step --, therefor.

15. In Column 10, Line 65, delete "Xj" and insert -- xj --, therefor.